(12) United States Patent
Kim et al.

(10) Patent No.: US 12,557,204 B2
(45) Date of Patent: *Feb. 17, 2026

(54) NOZZLE AND SUBSTRATE TREATING APPARATUS INCLUDING THE SAME

(71) Applicant: SEMES CO., LTD., Chungcheongnam-do (KR)

(72) Inventors: Sunmi Kim, Jeollanam-do (KR); Kyu Hwan Chang, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 250 days.

This patent is subject to a terminal disclaimer.

(21) Appl. No.: 17/365,020

(22) Filed: Jul. 1, 2021

(65) Prior Publication Data

US 2022/0007489 A1   Jan. 6, 2022

(30) Foreign Application Priority Data

Jul. 6, 2020  (KR) .......... 10-2020-0082545

(51) Int. Cl.
*H05H 1/34*    (2006.01)
*B05B 5/053*   (2006.01)
(Continued)

(52) U.S. Cl.
CPC ......... *H05H 1/3405* (2013.01); *B05B 5/0533* (2013.01); *H01J 37/32009* (2013.01);
(Continued)

(58) Field of Classification Search
CPC ........ H05H 1/3405; H05H 1/247; H05H 1/42; H05H 1/246; H05H 1/46; H05H 2245/40; H05H 1/2406; H05H 1/2418; H05H 1/2443; B05B 5/0533; B05B 7/222; B05B 14/40; B05B 13/0228; H01L 21/67075; H01L 21/6708; H01L 21/68764; H01L 21/67017; H01L 21/67069; H01L 21/67063; H01L 21/306; H01L 21/31111; H01L 21/32133; H01J 37/32009; H01J 37/32568;
(Continued)

(56) References Cited

U.S. PATENT DOCUMENTS 8,702,902 B2 *  4/2014  Blom ................... H05H 1/2475
                                                156/345.44
9,580,338 B2 *  2/2017  Fujikane ............. C02F 1/46114
(Continued)

FOREIGN PATENT DOCUMENTS

CN   103237404 A   8/2013
CN   205582880 U   9/2016
(Continued)

OTHER PUBLICATIONS

Macine English Translation of KR-20190134372-A (Year: 2019).*
(Continued)

*Primary Examiner* — Edward F Landrum
*Assistant Examiner* — Erwin J Wunderlich
(74) *Attorney, Agent, or Firm* — Li & Cai Intellectual Property (USA) Office

(57) ABSTRACT

An apparatus for treating a substrate includes a support unit that supports the substrate and a nozzle that dispenses liquid plasma to etch a film formed on the substrate supported on the support unit.

18 Claims, 8 Drawing Sheets

(51) Int. Cl.

| | | |
|---|---|---|
| *B24C 5/04* | (2006.01) | |
| *H01J 37/32* | (2006.01) | |
| *H01L 21/67* | (2006.01) | |
| *H05H 1/24* | (2006.01) | |
| *H05H 1/42* | (2006.01) | |
| *B05B 7/22* | (2006.01) | |
| *B05B 14/40* | (2018.01) | |
| *H01L 21/687* | (2006.01) | |
| *H05H 1/46* | (2006.01) | |

(52) U.S. Cl.
CPC .. *H01J 37/32449* (2013.01); *H01J 37/32568* (2013.01); *H01L 21/67017* (2013.01); *H01L 21/67075* (2013.01); *H01L 21/6708* (2013.01); *H05H 1/2406* (2013.01); *H05H 1/2418* (2021.05); *H05H 1/2443* (2021.05); *H05H 1/247* (2021.05); *H05H 1/42* (2013.01); *B01J 2219/0894* (2013.01); *B05B 7/222* (2013.01); *B05B 14/40* (2018.02); *B24C 5/04* (2013.01); *H01J 2237/334* (2013.01); *H01L 21/68764* (2013.01); *H05H 1/246* (2021.05); *H05H 1/46* (2013.01); *H05H 2245/40* (2021.05)

(58) Field of Classification Search
CPC ........... H01J 2237/334; H01J 37/32357; H01J 37/32449; H01J 37/32715; H01J 37/32733; B01J 2219/0894; B24C 5/04
USPC ...................................................... 219/121.5
See application file for complete search history.

(56) References Cited

U.S. PATENT DOCUMENTS

| | | | | |
|---|---|---|---|---|
| 11,529,655 | B2* | 12/2022 | Kim | ............... B08B 6/00 |
| 2004/0020598 | A1* | 2/2004 | Itatani | ............... B01D 53/70 |
| | | | | 156/345.29 |
| 2004/0206452 | A1* | 10/2004 | Okuda | ..................... B08B 3/02 |
| | | | | 156/345.11 |
| 2008/0173327 | A1* | 7/2008 | Miyagi | ................ B05B 7/0433 |
| | | | | 204/661 |
| 2016/0120013 | A1* | 4/2016 | Imai | ........................ H05H 1/48 |
| | | | | 315/111.21 |
| 2016/0203978 | A1* | 7/2016 | Hashimoto | ....... H01J 37/32541 |
| | | | | 118/723 R |
| 2017/0301573 | A1* | 10/2017 | Shibuya | .................. B24B 37/04 |
| 2017/0327390 | A1* | 11/2017 | Imada | .................. C02F 1/4608 |
| 2019/0035636 | A1* | 1/2019 | Yoshimizu | .............. H01J 37/32 |
| 2019/0256385 | A1* | 8/2019 | Matsuda | ..................... C02F 1/32 |
| 2019/0287765 | A1* | 9/2019 | Collins | ............. H01J 37/32568 |
| 2019/0352199 | A1* | 11/2019 | Matsuda | ................ B01J 19/088 |
| 2020/0407247 | A1* | 12/2020 | Horikoshi | ............. C02F 1/4608 |
| 2021/0086238 | A1* | 3/2021 | Horikoshi | ........... H01L 21/6708 |

FOREIGN PATENT DOCUMENTS

| | | | |
|---|---|---|---|
| JP | 2008-153322 | A | 7/2008 |
| JP | 2013206767 | A * | 10/2013 |
| KR | 10-2009-0019435 | A | 2/2009 |
| KR | 101582627 | B1 * | 1/2016 |
| KR | 101807002 | B1 | 12/2017 |
| KR | 20190134372 | A * | 12/2019 |
| KR | 1020190133957 | A | 12/2019 |
| KR | 1020190140886 | A | 12/2019 |
| KR | 10-2020-0045071 | A | 5/2020 |

OTHER PUBLICATIONS

Machine English Translation of JP-2013206767-A (Year: 2013).*
Machine English Translation of KR-101582627-B1 (Year: 2016).*
Korean Patent Office, Office action issued on Nov. 17, 2022.
China Patent Office, Office action issued on Feb. 29, 2024.
China Patent Office, non-final office action issued in Application No. 202110750867.9, Aug. 1, 2025.

* cited by examiner

NOZZLE AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2020-0082545 filed on Jul. 6, 2020, in the Korean Intellectual Property Office, the entire contents of which are hereby incorporated by reference.

BACKGROUND

Embodiments of the inventive concept described herein relate to a nozzle, a substrate treating apparatus including the same, and a substrate treating method, and more particularly, relate to a nozzle for dispensing a liquid onto a substrate to treat the substrate, a substrate treating apparatus including the nozzle, and a substrate treating method.

Plasma refers to an ionized gaseous state of matter containing ions, radicals, and electrons and is formed by very high temperature, or by application of a high electric field or an RF electromagnetic field. A semiconductor element manufacturing process may include an etching process of removing a thin film on a substrate, such as a wafer, using plasma. The etching process is performed by collision or reaction of ions and radicals contained in the plasma with the thin film on the substrate. A representative example of the etching process using the plasma is a dry etching process using gas plasma.

However, in the case of the dry etching process using the gas plasma, it is difficult to accurately deliver plasma to a target position on a substrate. For example, in the case of a bevel etching process of removing a thin film formed on an edge area of a substrate, it is very important to deliver plasma to only part of the edge area of the substrate where the thin film is desired to be removed. However, due to irregular fluidity of gas plasma, the plasma may be delivered up to an area other than the area where the thin film is desired to be removed. In this case, a thin film on an area where metal interconnection exists on the substrate may be removed. Due to this, substrate treating efficiency may be deteriorated, or a defect in a manufactured semiconductor element may be caused.

SUMMARY

Embodiments of the inventive concept provide a nozzle for efficiently treating a substrate, a substrate treating apparatus including the nozzle, and a substrate treating method.

Embodiments of the inventive concept provide a nozzle for effectively removing a thin film formed on a substrate, a substrate treating apparatus including the nozzle, and a substrate treating method.

Embodiments of the inventive concept provide a nozzle for accurately delivering plasma containing ions and radicals to a desired position on a substrate, a substrate treating apparatus including the nozzle, and a substrate treating method.

Embodiments of the inventive concept provide a nozzle for effectively generating plasma contained in a treatment liquid that is dispensed onto a substrate, a substrate treating apparatus including the nozzle, and a substrate treating method.

Embodiments of the inventive concept provide a nozzle for providing an additional factor in generation of plasma contained in a treatment liquid, a substrate treating apparatus including the nozzle, and a substrate treating method.

The technical problems to be solved by the inventive concept are not limited to the aforementioned problems, and any other technical problems not mentioned herein will be clearly understood from the following description by those skilled in the art to which the inventive concept pertains.

According to an embodiment, a nozzle for dispensing liquid plasma to etch a film formed on a substrate includes a body having an inner space, a liquid supply unit that supplies a liquid into the inner space, a gas supply unit that supplies an etching gas into the inner space, and electrodes that generate plasma in the inner space.

According to an embodiment, the gas supply unit may supply, into the inner space, the etching gas containing at least one of $Cl_2$, $CCl_2F_2$, $CF_4$, $SF_6$, $NH_3$, $BCL_3$, $CCl_4$, $Cl_2$, $O_2$, $NF_3$, or $CH_4$.

According to an embodiment, the liquid supply unit may supply the liquid in a bubbling state into the inner space, or may cause the liquid to bubble in the inner space.

According to an embodiment, the body may have a liquid inlet port through which the liquid supplied by the liquid supply unit is introduced into the inner space of the body, and the liquid inlet port may be provided such that the liquid introduced into the inner space through the liquid inlet port collides with an inner wall of the body to bubble in the inner space.

According to an embodiment, the liquid inlet port may be provided to be inclined when viewed from the front of the body.

According to an embodiment, positions of the electrodes may be changed to change a discharge area along a lengthwise direction of the nozzle, the discharge area being an area of the inner space in which plasma is generated.

According to an embodiment, the nozzle may further include an actuator that changes the positions of the electrodes.

According to an embodiment, the electrodes may include a first electrode inserted into the body and a second electrode that surrounds the body. One of the first electrode and the second electrode may be fixed, and the other may be movable along the lengthwise direction of the nozzle.

According to an embodiment, the nozzle may further include an insulating part that surrounds the first electrode, and the second electrode may be movable along a lengthwise direction of the first electrode.

According to an embodiment, one of the first electrode and the second electrode may be connected with a power supply, and the other one of the first electrode and the second electrode may be grounded.

According to an embodiment, an apparatus for treating a substrate includes a support unit that supports the substrate and a nozzle that dispenses liquid plasma to etch a film formed on the substrate supported on the support unit.

According to an embodiment, the nozzle may include a body having an inner space, a liquid supply unit that supplies a liquid into the inner space, a gas supply unit that supplies an etching gas into the inner space, and electrodes that generate plasma in the inner space.

According to an embodiment, the gas supply unit may supply, into the inner space, the etching gas containing at least one of $Cl_2$, $CCl_2F_2$, $CF_4$, $SF_6$, $NH_3$, $BCL_3$, $CCl_4$, $Cl_2$, $O_2$, $NF_3$, or $CH_4$.

According to an embodiment, the apparatus may further include a controller that controls the gas supply unit, and the controller controls the gas supply unit such that the type of gas supplied into the inner space is changed depending on the type of film formed the substrate.

According to an embodiment, the liquid supply unit may supply the liquid in a bubbling state into the inner space, or may cause the liquid to bubble in the inner space.

According to an embodiment, positions of the electrodes may be changed to change a discharge area along a lengthwise direction of the nozzle, the discharge area being an area of the inner space in which plasma is generated.

According to an embodiment, an apparatus for treating a substrate includes a housing having a treatment space, a support unit that supports the substrate in the treatment space, and a liquid dispensing unit that dispenses a treatment liquid containing plasma onto the substrate supported on the support unit. The liquid dispensing unit includes a nozzle that dispenses the treatment liquid and a moving member that moves the nozzle. The nozzle includes a body having an inner space, a liquid supply unit that supplies the treatment liquid in a bubbling state into the inner space or causes the treatment liquid to bubble in the inner space, a gas supply unit that supplies an etching gas into the inner space, and electrodes that generate plasma in the inner space.

According to an embodiment, the gas supply unit may supply, into the inner space, the etching gas containing at least one of $Cl_2$, $CCl_2F_2$, $CF_4$, $SF_6$, $NH_3$, $BCL_3$, $CCl_4$, $Cl_2$, $O_2$, $NF_3$, or $CH_4$.

According to an embodiment, provided is a method for treating a substrate, in which a nozzle dispenses liquid plasma onto the substrate to treat a surface of the substrate.

According to an embodiment, an etching gas may be supplied into an inner space of the nozzle to generate the liquid plasma in the inner space.

According to an embodiment, the etching gas may contain at least one of $Cl_2$, $CCl_2F_2$, $CF_4$, $SF_6$, $NH_3$, $BCL_3$, $CCl_4$, $Cl_2$, $O_2$, $NF_3$, or $CH_4$.

According to an embodiment, the type of etching gas supplied into the inner space may be changed depending on the type of film formed on the substrate.

According to an embodiment, a treatment liquid in a bubbling state may be supplied into the inner space, or a treatment liquid may bubble in the inner space. The liquid plasma may be generated by applying electric power to the treatment liquid in the bubbling state.

According to an embodiment, an electrode that applies the electric power to the treatment liquid may surround the inner space, and a discharge area of the inner space in which the liquid plasma is generated may be changed by changing the position of the electrode.

According to an embodiment, the nozzle may dispense the liquid plasma in the manner of a stream.

According to an embodiment, the substrate may be rotated while the nozzle dispenses the liquid plasma onto the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
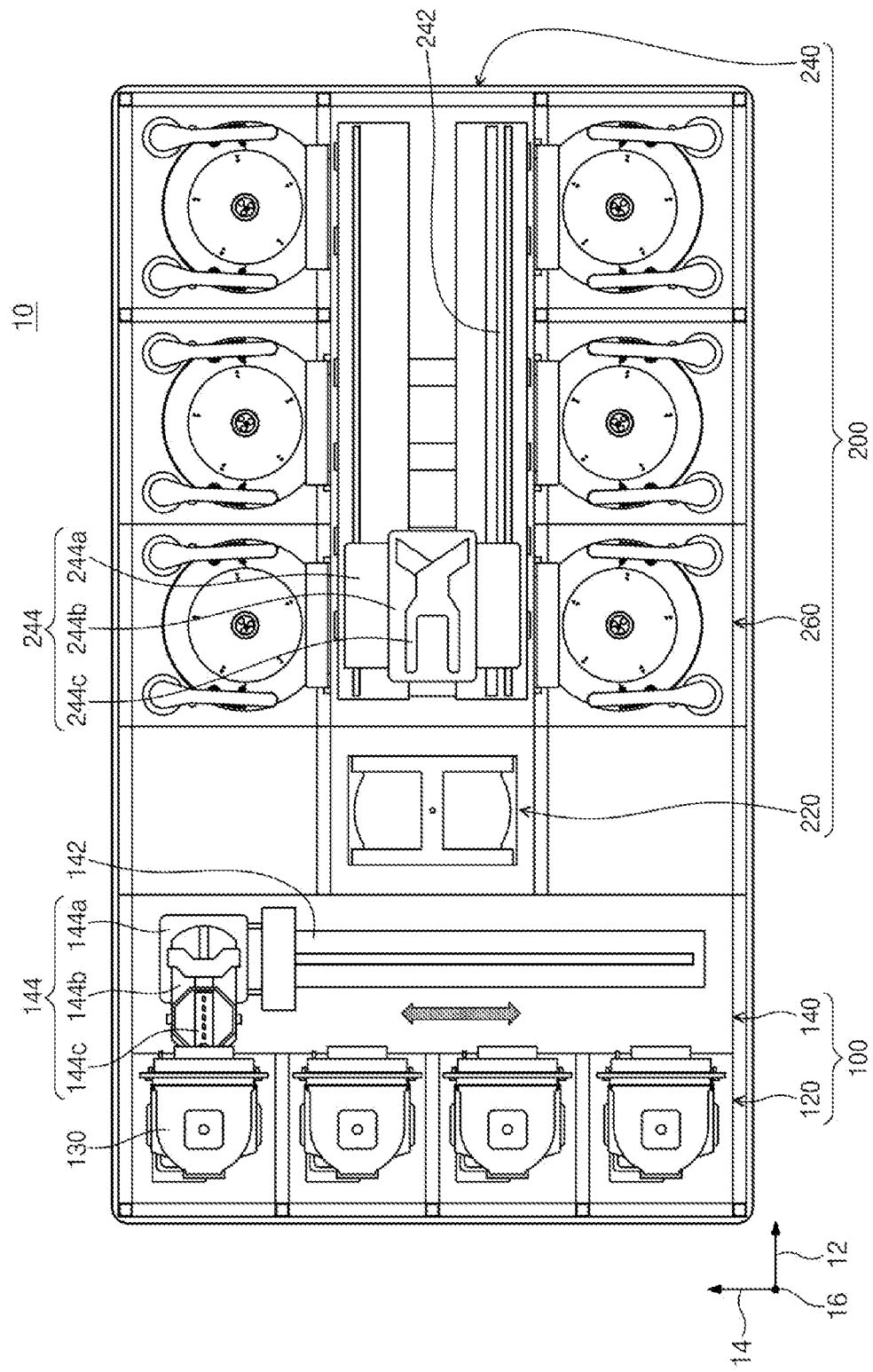
FIG. 1 is a plan view illustrating substrate treating equipment according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 1 to 11.

FIG. 1 is a plan view illustrating substrate treating equipment according to an embodiment of the inventive concept.

Referring to FIG. 1, the substrate treating equipment 10 includes an index module 100 and a process module 200. The index module 100 includes a load port 120 and a transfer frame 140. The load port 120, the transfer frame 140, and the process module 200 are sequentially arranged in a row. Hereinafter, a direction in which the load port 120, the transfer frame 140, and the process module 200 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

A carrier 130 having substrates W received therein is seated on the load port 120. A plurality of load ports 120 may be provided. The load ports 120 may be disposed in a row along the second direction 14. The number of load ports 120 may be increased or decreased depending on process efficiency and footprint of the process module 200. The carrier 130 has a plurality of slots (not illustrated) formed therein in which the substrates W are received in horizontal positions relative to the ground. A front opening unified pod (FOUP) may be used as the carrier 130.

The process module 200 includes a buffer unit 220, a transfer chamber 240, and process chambers 260. The transfer chamber 240 is disposed such that the lengthwise direction thereof is parallel to the first direction 12. The process chambers 260 are disposed on opposite sides of the transfer chamber 240. On the opposite sides of the transfer chamber 240, the process chambers 260 are provided to be symmetric with respect to the transfer chamber 240. A plurality of process chambers 260 are provided on one side of the transfer chamber 240. Some of the process chambers 260 are disposed along the lengthwise direction of the transfer chamber 240. Furthermore, other process chambers 260 are stacked one above another. That is, the process chambers 260 may be disposed in an A×B array on the one side of the transfer chamber 240. Here, "A" denotes the number of process chambers 260 provided in a row along the first direction 12, and "B" denotes the number of process chambers 260 provided in a column along the third direction 16. When four or six process chambers 260 are provided on the one side of the transfer chamber 240, the process chambers 260 may be disposed in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) formed therein in which the substrates W are received. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and an index arm 144c. The base 144a is movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c may be provided. The index arms 144c may be individually driven. The index arms 144c may be stacked one above another with a spacing gap therebetween along the third direction 16. Some of the index arms 144c may be used to transfer the substrates W from the process module 200 to the carriers 130, and the other index arms 144c may be used to transfer the substrates W from the carriers 130 to the process module 200. Accordingly, particles generated from the substrates W to be treated may be prevented from adhering to the treated substrates W in a process in which the index robot 144 transfers the substrates W between the carriers 130 and the process module 200.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244a, a body 244b, and a main arm 244c. The base 244a is movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c may be provided. The main arms 244c may be individually driven. The main arms 244c may be stacked one above another with a spacing gap therebetween along the third direction 16.

The process chambers 260 are equipped with substrate treating apparatuses that perform liquid treatment processes on the substrates W. For example, the process chambers 260 may be chambers that perform cleaning processes by dispensing cleaning solutions onto the substrates W. Alternatively, the process chambers 260 may be chambers that perform wet etching processes of removing thin films on the substrates W by dispensing liquid plasma onto the substrates W. The substrate treating apparatuses provided in the process chambers 260 may have different structures depending on the types of processes of treating the substrates W. Alternatively, the substrate treating apparatuses in the respective process chambers 260 may have the same structure. Selectively, the process chambers 260 may be divided into a plurality of groups. Process chambers 260 belonging to one of the groups may be process chambers that perform one of a cleaning process and a wet etching process, and process chambers 260 belonging to another one of the groups may be process chambers that perform the other one of the cleaning process and the wet etching process.

Hereinafter, a process chamber 260 that performs a liquid treatment process of treating a substrate W by dispensing a treatment liquid onto the substrate W will be described. Specifically, a process chamber 260 that performs a wet etching process of removing a thin film on a substrate W by dispensing liquid plasma onto the substrate W will be described below. The liquid plasma dispensed onto the substrate W may refer to a treatment medium containing plasma in a treatment liquid.

Figure 2:
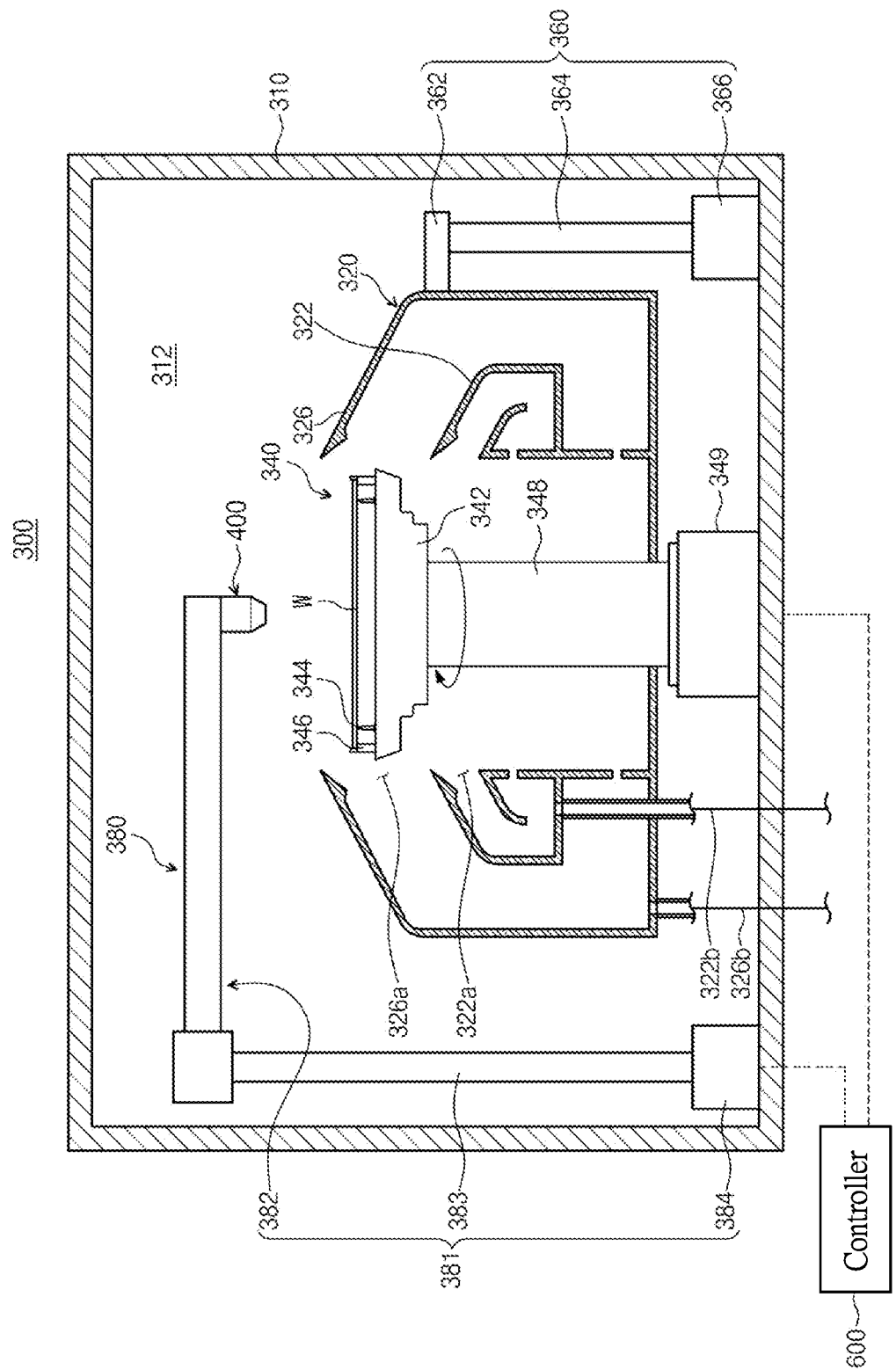
FIG. 2 is a sectional view illustrating a substrate treating apparatus of FIG. 1.

FIG. 2 is a sectional view illustrating a substrate treating apparatus of FIG. 1. Referring to FIG. 2, the substrate treating apparatus 300 includes a housing 310, a treatment vessel 320, a support unit 340, a lifting unit 360, a liquid dispensing unit 380, and a controller 600.

The housing 310 has a treatment space 312 inside. The housing 310 may have a container shape having a space inside. The treatment vessel 320, the support unit 340, the lifting unit 360, and the liquid dispensing unit 380 may be provided in the treatment space 312 of the housing 310. The housing 310 may have a quadrilateral shape when viewed from the front. Without being limited thereto, however, the housing 310 may be implemented in various shapes having the treatment space 312 inside.

The treatment vessel 320 has a cylindrical shape that is open at the top. The treatment vessel 320 has an inner recovery bowl 322 and an outer recovery bowl 326. The recovery bowls 322 and 326 recover different treatment liquids used for processes. The inner recovery bowl 322 has an annular ring shape that surrounds the support unit 340, and the outer recovery bowl 326 has an annular ring shape that surrounds the inner recovery bowl 322. An inner space 322a of the inner recovery bowl 322 and the inner recovery bowl 322 function as a first inlet 322a through which a treatment liquid is introduced into the inner recovery bowl 322. A space 326a between the inner recovery bowl 322 and the outer recovery bowl 326 functions as a second inlet 326a through which a treatment liquid is introduced into the outer recovery bowl 326. According to an embodiment, the inlets 322a and 326a may be located at different heights. Recovery lines 322b and 326b are connected to the bottoms of the recovery bowls 322 and 326, respectively. The treatment liquids introduced into the recovery bowls 322 and 326 may be delivered to an external treatment liquid regeneration system (not illustrated) through the recovery lines 322b and 326b and may be regenerated by the regeneration system.

The support unit 340 supports a substrate W in the treatment space 312. The support unit 340 supports and rotates the substrate W during a process. The support unit 340 has a support plate 342, a support pin 344, a chuck pin 346, and a rotary drive member 348 and 349.

The support plate 342 is provided in a substantially circular plate shape and has an upper surface and a lower surface. The lower surface has a smaller diameter than the upper surface. That is, the support plate 342 may have a shape that is wide at the top and narrow at the bottom. The upper surface and the lower surface are located such that the central axes thereof are in agreement with each other. Furthermore, a heating unit (not illustrated) may be provided inside the support plate 342. The heating unit inside the support plate 342 may heat the substrate W placed on the support plate 342. The heating unit may generate heat. The heat generated by the heating unit may be warm-heat or cold-heat. The heat generated by the heating unit may be transferred to the substrate W placed on the support plate 342. The heat transferred to the substrate W may heat the treatment liquids dispensed onto the substrate W. The heating unit may be a heater and/or a cooling coil. Without being limited thereto, however, the heating unit may be implemented with various well-known devices.

The support plate 342 is equipped with a plurality of support pins 344. The support pins 344 are disposed on an edge portion of the upper surface of the support plate 342 so as to be spaced apart from each other at predetermined intervals. The support pins 344 protrude upward from the support plate 342. The support pins 344 are disposed to form an annular ring shape as a whole by a combination thereof. The support pins 344 support the edge of a rear surface of the substrate W such that the substrate W is spaced apart from the upper surface of the support plate 342 by a predetermined distance.

The support plate 342 is equipped with a plurality of chuck pins 346. The chuck pins 346 are disposed farther away from the center of the support plate 342 than the support pins 344. The chuck pins 346 protrude upward from the upper surface of the support plate 342. The chuck pins 346 support a lateral portion of the substrate W such that the substrate W does not deviate from a correct position to a side when the support plate 342 is rotated. The chuck pins 346 are rectilinearly movable between an outer position and an inner position along the radial direction of the support plate 342. The outer position is a position farther away from the center of the support plate 342 than the inner position. When the substrate W is loaded onto or unloaded from the support plate 342, the chuck pins 346 are located in the outer position, and when a process is performed on the substrate W, the chuck pins 346 are located in the inner position. The inner position is a position in which the chuck pins 346 are brought into contact with the lateral portion of the substrate W, and the outer position is a position in which the chuck pins 346 are spaced apart from the substrate W.

The rotary drive member 348 and 349 rotates the support plate 342. The support plate 342 is rotatable about the central axis thereof by the rotary drive member 348 and 349. The rotary drive member 348 and 349 includes a support shaft 348 and an actuator 349. The support shaft 348 has a cylindrical shape facing the third direction 16. An upper end of the support shaft 348 is fixedly coupled to the lower surface of the support plate 342. According to an embodiment, the support shaft 348 may be fixedly coupled to the center of the lower surface of the support plate 342. The actuator 349 provides a driving force to rotate the support shaft 348. The support shaft 348 is rotated by the actuator 349, and the support plate 342 is rotatable together with the support shaft 348.

The lifting unit 360 rectilinearly moves the treatment vessel 320 in an up-down direction. As the treatment vessel 320 is moved in the up-down direction, the height of the treatment vessel 320 relative to the support plate 342 is changed. The lifting unit 360 lowers the treatment vessel 320 such that the support plate 342 further protrudes upward beyond the treatment vessel 320 when the substrate W is loaded onto or unloaded from the support plate 342. Furthermore, while a process is performed, the height of the treatment vessel 320 is adjusted depending on the types of treatment liquids dispensed onto the substrate W, such that the treatment liquids are introduced into the preset recovery bowls 322 and 326. The lifting unit 360 has a bracket 362, a movable shaft 364, and an actuator 366. The bracket 362 is fixedly attached to an outer wall of the treatment vessel 320, and the movable shaft 364 is fixedly coupled to the bracket 362 and is moved in the up-down direction by the actuator 366. Selectively, the lifting unit 360 may move the support plate 342 in the up-down direction.

The liquid dispensing unit 380 may dispense liquid plasma onto the substrate W. The liquid plasma may contain plasma and a treatment liquid. In other words, the liquid plasma may refer to a treatment medium that contains the plasma in the treatment liquid. The treatment liquid may be a chemical, a rinsing solution, a wetting solution, a cleaning solution, or an organic solvent. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The chemical may be a diluted sulfuric acid peroxide (DSP) mixture. The cleaning solution, the rinsing solution, and the wetting solution may be deionized water ($H_2O$). The organic solvent may be isopropyl alcohol (IPA).

The liquid dispensing unit 380 may include a moving member 381 and a nozzle 400. The moving member 381 moves the nozzle 400 between a process position and a standby position. The process position is a position in which the nozzle 400 faces the substrate W supported on the support unit 340. According to an embodiment, the process position is a position in which the nozzle 400 dispenses the treatment liquid onto an upper surface of the substrate W. The process position includes a first dispensing position and a second dispensing position. The first dispensing position may be a position closer to the center of the substrate W than the second dispensing position, and the second dispensing position may be a position including an end portion of the substrate W. Selectively, the second dispensing position may be an area adjacent to the end portion of the substrate W. The standby position is defined as a position in which the nozzle 400 deviates from the process position. According to an embodiment, the standby position may be a position in which the nozzle 400 stands by before or after a process is performed on the substrate W.

The moving member 381 includes an arm 382, a support shaft 383, and an actuator 384. The support shaft 383 is located on one side of the treatment vessel 320. The support shaft 383 has a rod shape, the lengthwise direction of which is parallel to the third direction 16. The support shaft 383 is rotatable by the actuator 384. The support shaft 383 is movable upward and downward. The arm 382 is coupled to an upper end of the support shaft 383. The arm 382 extends from the support shaft 383 at a right angle thereto. The nozzle 400 is coupled to a tip end of the arm 382. A liquid supply unit for supplying the treatment liquid to the nozzle 400 may be provided inside the arm 382. Furthermore, a gas supply unit for supplying a gas to the nozzle 400 may be provided inside the arm 382. The liquid supply unit and the gas supply unit may each include a valve (not illustrated). The valve (not illustrated) may be an on/off valve or a flow-rate control valve. The nozzle 400 may be coupled to the arm 382 such that the angle at which the nozzle 400 dispenses the treatment liquid onto the upper surface of the substrate W is adjustable. As the support shaft 383 is rotated, the nozzle 400 may be swung together with the arm 382. The nozzle 400 may be moved between the process position and the standby position. Selectively, the arm 382 is movable forward and backward along the lengthwise direction thereof. When viewed from above, a path along which the nozzle 400 is moved may be in agreement with the central axis of the substrate W in the process position.

The controller 600 may control the substrate treating apparatus 300. The controller 600 may control the components of the substrate treating apparatus 300. For example, the controller 600 may control the support unit 340 and the liquid dispensing unit 380. Furthermore, the controller 600 may control the substrate treating apparatus 300 to perform a substrate treating method that will be described below. For example, the controller 600 may control the support unit 340 and the liquid dispensing unit 380 to perform the substrate treating method that will be described below.

Figure 3:
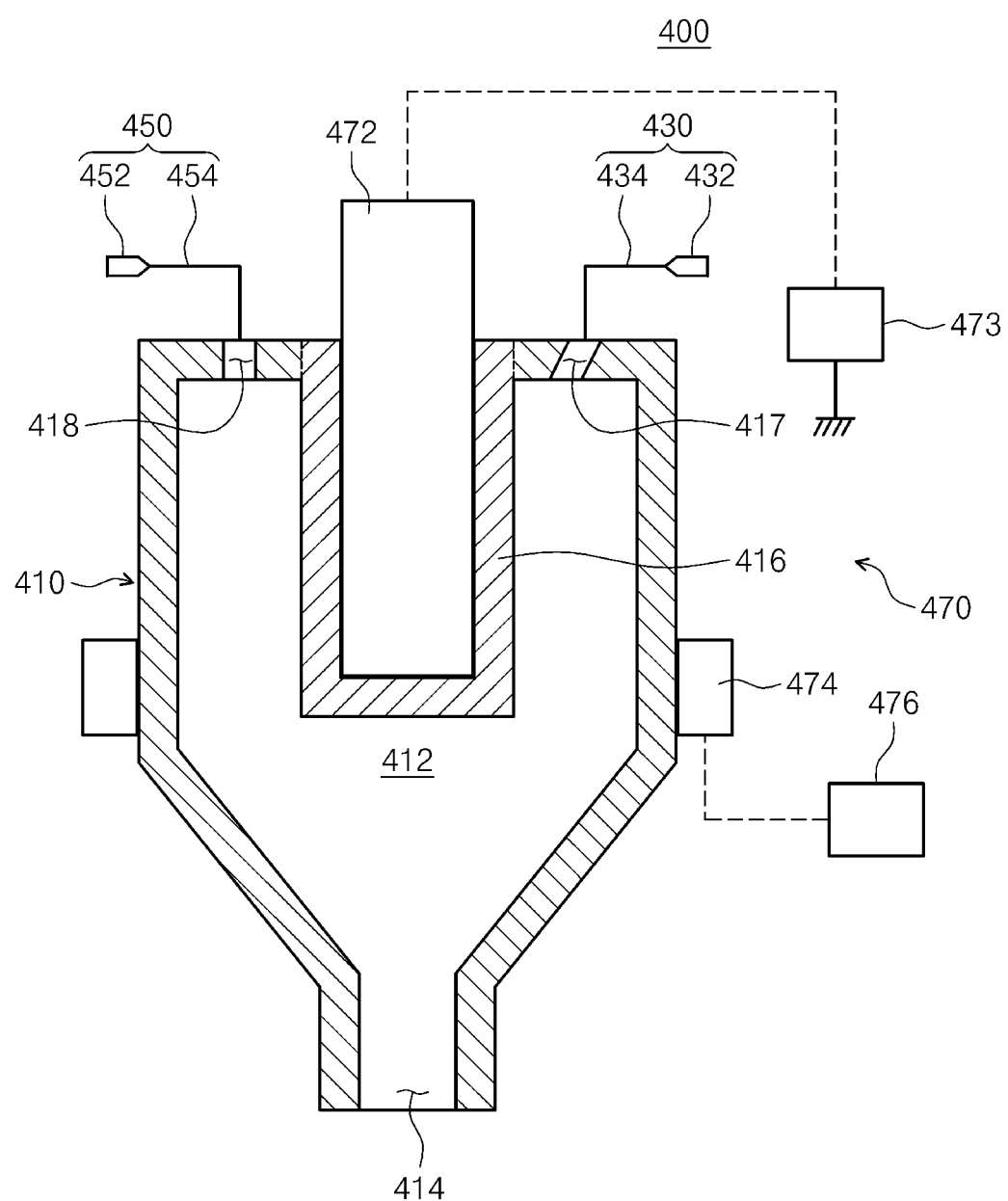
FIG. 3 is a sectional view illustrating a nozzle of FIG. 2.

Hereinafter, the nozzle 400 according to an embodiment of the inventive concept will be described in detail with reference to FIG. 3. FIG. 3 is a sectional view illustrating the nozzle of FIG. 2. Referring to FIG. 3, the nozzle 400 may include a body 410, a liquid supply unit 430, a gas supply unit 450, and a plasma generation unit 470.

The body 410 may have an inner space 412. The body 410 may be implemented with an insulator. The body 410 may be formed of a material containing quartz. The body 410 may have a dispensing opening 414 formed therein. The dispensing opening 414 may be formed in a lower end portion of the body 410. The dispensing opening 414 may be configured to dispense, in the manner of a stream, a treatment liquid introduced into the inner space 412. The dispensing opening 414 may be a hole. The dispensing opening 414 may be a circular hole. However, without being limited thereto, the dispensing opening 414 may be implemented in various shapes capable of dispensing the treatment liquid in the manner of a stream. When the dispensing opening 414 dispenses the treatment liquid in the manner of a stream, damage to a pattern formed on the substrate W may be relatively minimized, as compared with when the treatment liquid is dispensed in the manner of a mist.

The body 410 may include a discharge part and a dispensing part. The discharge part may be an area in which the plasma generation unit 470 generates plasma. For example, the discharge part may refer to an area surrounded by a second electrode 474 that will be described below, and/or an area on which the second electrode 474 is movable in the up-down direction. The dispensing part may be an area through which the treatment liquid in which plasma is generated is delivered to the dispensing opening 414. The dispensing part may extend downward from the discharge part and may have a gradually decreasing width toward the dispensing opening 414.

The body 410 may further include an insulating part 416. The insulating part 416 may be an insulator. The insulating part 416 may be formed of a material containing quartz. The insulating part 416 may be provided in the inner space 412. A portion of the insulating part 416 may be provided in the inner space 412. The insulating part 416 may be inserted into the inner space 412 through an opening formed in the body 410. The opening formed in the body 410 may have a circular shape. The insulating part 416 may have a container shape that is open at the top. For example, the insulating part 416 may have a cylindrical shape that is open at the top. A first electrode 472, which will be described below, may be inserted into the insulating part 416. That is, the insulating part 416 may surround the first electrode 472.

A liquid inlet port 417 may be formed in the body 410. The liquid inlet port 417 may be formed in an upper portion of the body 410. The liquid inlet port 417 may provide a passage through which the treatment liquid is introduced into the inner space 412. The liquid inlet port 417 may be provided such that the treatment liquid introduced into the inner space 412 through the liquid inlet port 417 collides with an inner wall of the body 410. For example, the liquid inlet port 417 may be provided to be inclined when viewed from the front of the body 410. The liquid inlet port 417 may be implemented with an inclined opening when viewed from the front of the body 410. Accordingly, the treatment liquid introduced into the inner space 412 through the liquid inlet port 417 may collide with the inner wall of the body 410 to bubble in the inner space 412. The liquid inlet port 417 is not limited to the inclined opening and may be implemented in various shapes capable of causing the treatment liquid to bubble in the inner space 412. The liquid inlet port 417 may be connected with a liquid supply line 434 that will be described below.

A gas inlet port 418 may be formed in the body 410. The gas inlet port 418 may be formed in the upper portion of the body 410. The gas inlet port 418 may provide a passage through which a gas is introduced into the inner space 412. The gas inlet port 418 may be implemented with a straight opening when viewed from the front of the body 410. However, without being limited thereto, the gas inlet port 418 may be implemented with an inclined opening, similarly to the liquid inlet port 417. The gas inlet port 418 may be connected with a gas supply line 454 that will be described below.

The liquid supply unit 430 may supply the treatment liquid into the inner space 412. The liquid supply unit 430 may include a liquid supply source 432 and the liquid supply line 434. The liquid supply source 432 may store the treatment liquid that the nozzle 400 dispenses. The liquid supply source 432 may be a source that stores the treatment liquid. The treatment liquid stored by the liquid supply source 432 may be deionized water. The liquid supply source 432 may be connected with the liquid supply lines 434. The liquid supply line 434 may receive the treatment liquid from the liquid supply source 432 and may deliver the treatment liquid to the liquid inlet port 417. A valve (not illustrated) may be disposed in line-with the liquid supply line 434. The valve may be an on/off valve or a flow-rate control valve.

The liquid supply unit 430 may supply the treatment liquid in a bubbling state into the inner space 412. For example, the liquid supply source 432 may cause the treatment liquid to bubble therein and may deliver the treatment liquid in the bubbling state to the liquid supply line 434. Alternatively, the liquid supply source 432 may deliver the treatment liquid to the liquid supply line 434, and the treatment liquid may bubble in the liquid supply line 434. In another case, the liquid supply unit 430 may be provided such that the treatment liquid supplied into the inner space 412 bubbles in the inner space 412. For example, the liquid supply line 434 of the liquid supply unit 430 may be connected with the liquid inlet port 417 that is an inclined opening. The treatment liquid supplied into the inner space 412 through the liquid supply line 434 may collide with the inner wall of the body 410 to bubble in the inner space 412.

The gas supply unit 450 may supply the gas into the inner space 412. The gas supply unit 450 may include a gas supply source 452 and the gas supply line 454. The gas supply source 452 may store the gas that is supplied into the inner space 412. The gas stored by the gas supply source 452 may be a gas that is excited into plasma. The gas stored by the gas supply source 452 may be excited into plasma by electric power applied by the plasma generation unit 470 that will be described below. The gas stored by the gas supply source 452 may be an etching gas. The etching gas stored by the gas supply source 452 may be a gas containing at least one of $Cl_2$, $CCl_2F_2$, $CF_4$, $SF_6$, $NH_3$, $BCL_3$, $CCl_4$, $Cl_2$, $O_2$, $NF_3$, or $CH_4$. Alternatively, the etching gas may be a gas containing a combination of at least two of $Cl_2$, $CCl_2F_2$, $CF_4$, $SF_6$, $NH_3$, $BCL_3$, $CCl_4$, $Cl_2$, $O_2$, $NF_3$, or $CH_4$.

The gas supply source 452 may supply, into the inner space 412, an etching gas selected from different types of gases. For example, the gas supply source 452 may include a plurality of gas supply sources, and the plurality of gas supply sources may supply different types of etching gases into the inner space 412. That is, the gas supply source 452 may supply different types of etching gases into the inner space 412 to variously change the types of active radicals of plasma contained in the treatment liquid. When the types of etching gases differ from one another, it should be construed that the types of components contained in the etching gases differ from one another, or the composition ratios differ from one another even though the types of components contained in the etching gases are the same as one another.

The gas supply source 452 may be connected with the gas supply line 454. The gas supply line 454 may receive an etching gas from the gas supply source 452 and may deliver the etching gas to the gas inlet port 418. A valve (not illustrated) may be disposed in line-with the gas supply line 454. The valve may be an on/off valve or a flow-rate control valve.

The plasma generation unit 470 may generate plasma in the inner space 412. The plasma generation unit 470 may include the electrodes 472 and 474, a power supply 473, and an actuator 476.

The electrodes 472 and 474 may include the first electrode 472 and the second electrode 474. The first electrode 472 may have a bar shape. The first electrode 472 may be inserted into the insulating part 416 included in the body 410. The first electrode 472 may be provided in the inner space 412. The first electrode 472 provided in the inner space 412 may be surrounded by the insulating part 416. Accordingly, a risk that the first electrode 472 is damaged by contact with the treatment liquid may be minimized. The second electrode 474 may have a ring shape. The second electrode 474 may have a circular ring shape. The second electrode 474 may surround the inner space 412. For example, the second electrode 474 may be provided on the exterior of the body 410.

One of the first electrode 472 and the second electrode 474 may be connected with the power supply 473 that applies electric power. The other one of the first electrode 472 and the second electrode 474 may be grounded. For example, the first electrode 472 may be connected with the power supply 472, and the second electrode 474 may be grounded. However, without being limited thereto, the second electrode 474 may be connected with the power supply 473, and the first electrode 472 may be grounded.

The positions of the electrodes 472 and 474 may be changed. The electrodes 472 and 474 may be movable to change a discharge area of the inner space 412 in which plasma is generated from the treatment liquid and/or the etching gas. One of the first electrode 472 and the second electrode 474 may be fixed. The other one of the first electrode 472 and the second electrode 474 may be movable to change the discharge area along the lengthwise direction of the nozzle 400. For example, the first electrode 472 may be fixed, and the second electrode 474 may be movable along the lengthwise direction of the first electrode 472. The actuator 476 may be connected with the second electrode 474 and may change the position of the second electrode 474.

The controller 600 may control the substrate treating apparatus 300. For example, the controller 600 may control the substrate treating apparatus 300 such that the substrate treating apparatus 300 performs a treatment process on the substrate W. For example, the controller 600 may control the liquid dispensing unit 380 and the support unit 340 such that the substrate treating apparatus 300 performs an etching process on the substrate W.

Figure 4:
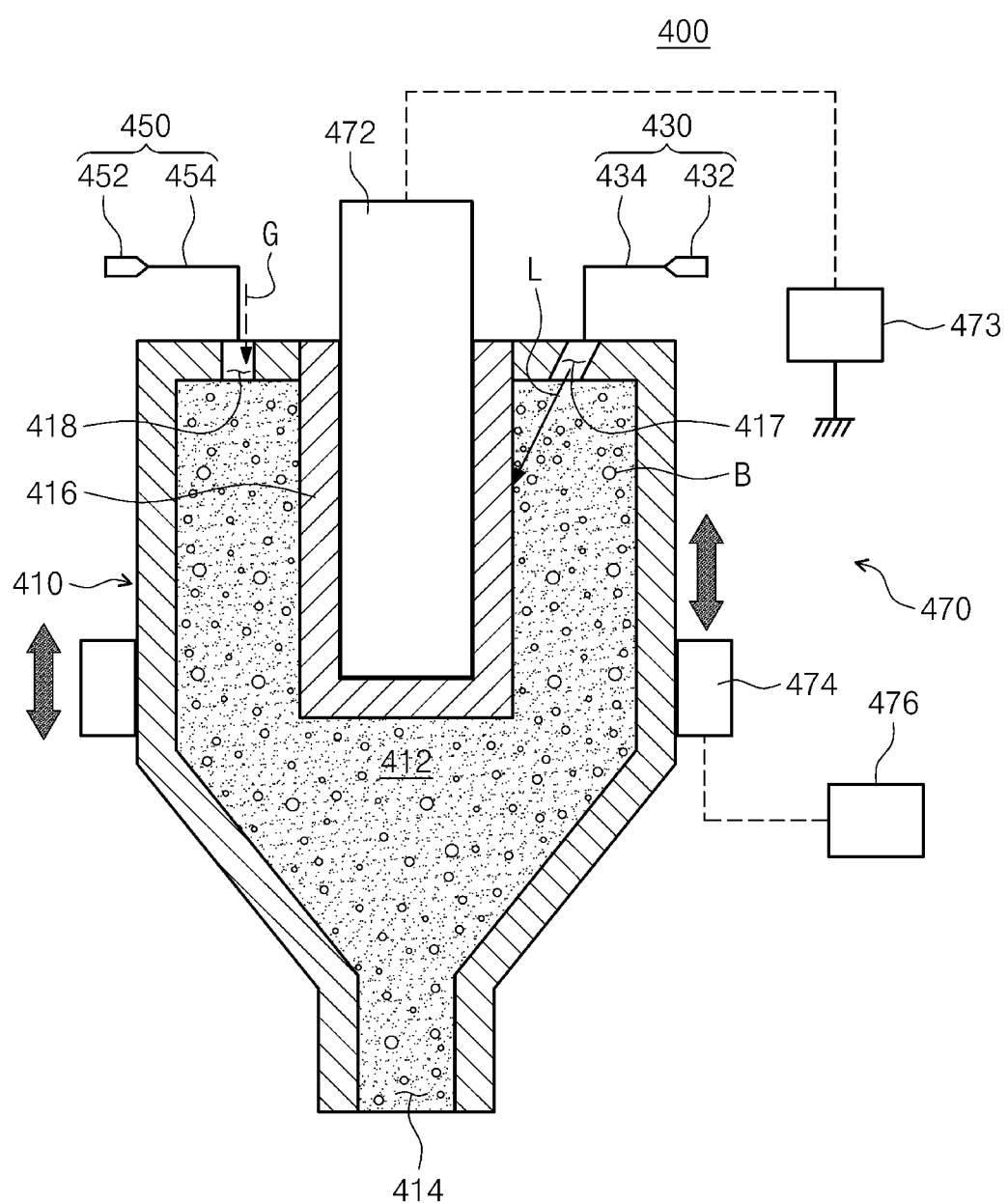
FIG. 4 is a view illustrating a state in which plasma is generated in the nozzle of FIG. 2.
Figure 5:
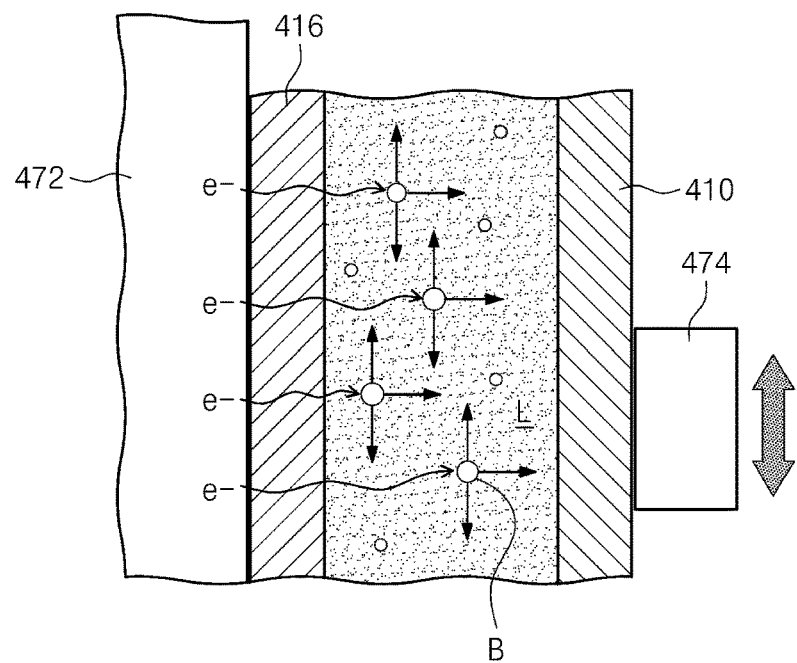
FIG. 5 is a view illustrating part of the nozzle of FIG. 4.

FIG. 4 is a view illustrating a state in which plasma is generated in the nozzle of FIG. 2, and FIG. 5 is a view illustrating part of the nozzle of FIG. 4. Referring to FIGS. 4 and 5, the nozzle 400 may generate a treatment liquid L that contains plasma, that is, liquid plasma and may dispense the generated liquid plasma onto a substrate W. The plasma contained in the treatment liquid L may be generated through bubbles B produced by the treatment liquid L that bubbles in the nozzle 400. Furthermore, the plasma contained in the treatment liquid L may be generated through an etching gas G.

When the treatment liquid L in a bubbling state is supplied into the inner space 412 or the treatment liquid L bubbles in the inner space 412, the bubbles B are produced in the treatment liquid L. At this time, the electrodes 472 and 474 may apply voltage to the bubbles B to generate plasma. The permittivity of the bubbles B is significantly lower than the permittivity of the treatment liquid L in a liquid state. For example, in a case where the treatment liquid L is deionized water, the permittivity of the treatment liquid L is 80.4, and the permittivity of the bubbles B is 1.0. An electric field generated by the electrodes 472 and 474 is applied to the bubbles B having a low permittivity. Accordingly, plasma discharge is generated even by low critical voltage. That is, plasma discharge efficiency may be significantly improved. In other words, power consumption required to generate plasma in the treatment liquid L may be minimized. Furthermore, even if the same electric power is applied, a plasma generation rate may be relatively significantly increased.

According to an embodiment of the inventive concept, the positions of the electrodes 472 and 474 may be changed. For example, the position of the second electrode 474 may be changed. Accordingly, the discharge area of the inner space 412 in which plasma is generated from the bubbles B contained in the treatment liquid L may be changed. That is, the change in the position of the second electrode 474 may minimize a limitation in the discharge area and may enable prevention of electrification. Furthermore, in generating plasma by changing the position of the second electrode 474, an additional control factor may be provided. Moreover, the position of the second electrode 474 may be changed while the nozzle 400 dispenses the treatment liquid L. The position of the second electrode 474 may be changed in a downward direction or in an upward direction.

The gas supply unit 450 may supply the etching gas G into the inner space 412. The gas G may cause the treatment liquid L supplied into the inner space 412 to bubble in the inner space 412. Furthermore, the etching gas G supplied into the inner space 412 may be excited by the plasma generation unit 470. Accordingly, the etching gas G supplied into the inner space 412 may be a source of active radicals.

Figure 6:
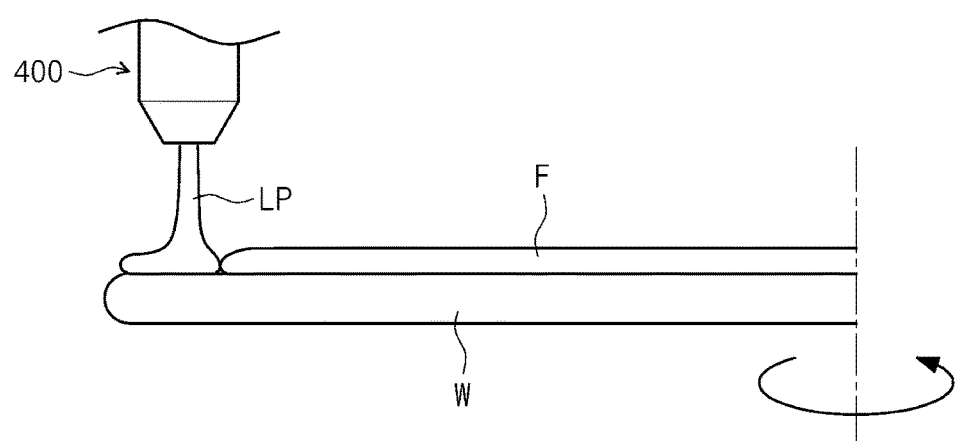
FIG. 6 is a view illustrating a state in which the nozzle of FIG. 2 dispenses liquid plasma onto a substrate to treat the substrate.

Hereinafter, a substrate treating method according to an embodiment of the inventive concept will be described. To perform the substrate treating method according to the embodiment of the inventive concept, the controller 600 may control the substrate treating apparatus 300 as described above. In the substrate treating method according to the embodiment of the inventive concept, the treatment liquid L containing plasma, that is, liquid plasma LP is generated in the inner space 412 of the nozzle 400, and the nozzle 400 dispenses the generated liquid plasma LP onto the substrate W as illustrated in FIG. 6. At this time, a feed gas supplied into the inner space 412 of the nozzle 400 may be the etching gas G. For example, the etching gas G may contain $CF_4$, $NF_3$, $CH_4$, or the like. Accordingly, the liquid plasma LP generated in the inner space 412 of the nozzle 400 may contain radicals of $CF_x$, $CHF_x$, $NF_x$, or the like (x being an integer). The liquid plasma LP containing the activated radicals may be dispensed onto the substrate W to etch a thin film F formed on the substrate W. Furthermore, the liquid plasma LP may etch a silicon oxide film, a silicon nitride film, or the thin film F having poly silicon on the substrate W to change a surface of the thin film F existing on the substrate W.

Because the radicals contained in the liquid plasma LP are dispensed onto the substrate W together with the treatment liquid L, the radicals may be more accurately dispensed onto the substrate W than when gas plasma is used as a treatment medium. This is because the gas plasma has irregular fluidity, whereas the liquid plasma LP has more regular fluidity than the gas plasma. The nozzle 400 may dispense the liquid plasma LP in the manner of a stream. Accordingly, the position where the radicals are dispensed onto the substrate W may be accurately adjusted. In a case of etching only the thin film F existing on an edge area of the substrate W, the nozzle 400 may dispense the liquid plasma LP from above the edge area of the substrate W, and the substrate W may be rotated while the liquid plasma LP is dispensed. Accordingly, the liquid plasma LP dispensed onto the edge area of the substrate W may be scattered outside the substrate W by a centrifugal force depending on the rotation of the substrate W. In other words, when the liquid plasma LP is dispensed onto the edge area of the substrate W while the substrate W is rotated, the dispensed liquid plasma LP may be scattered toward a central area of the substrate W to prevent the thin film F existing on the central area of the substrate W from being etched.

Figure 7:
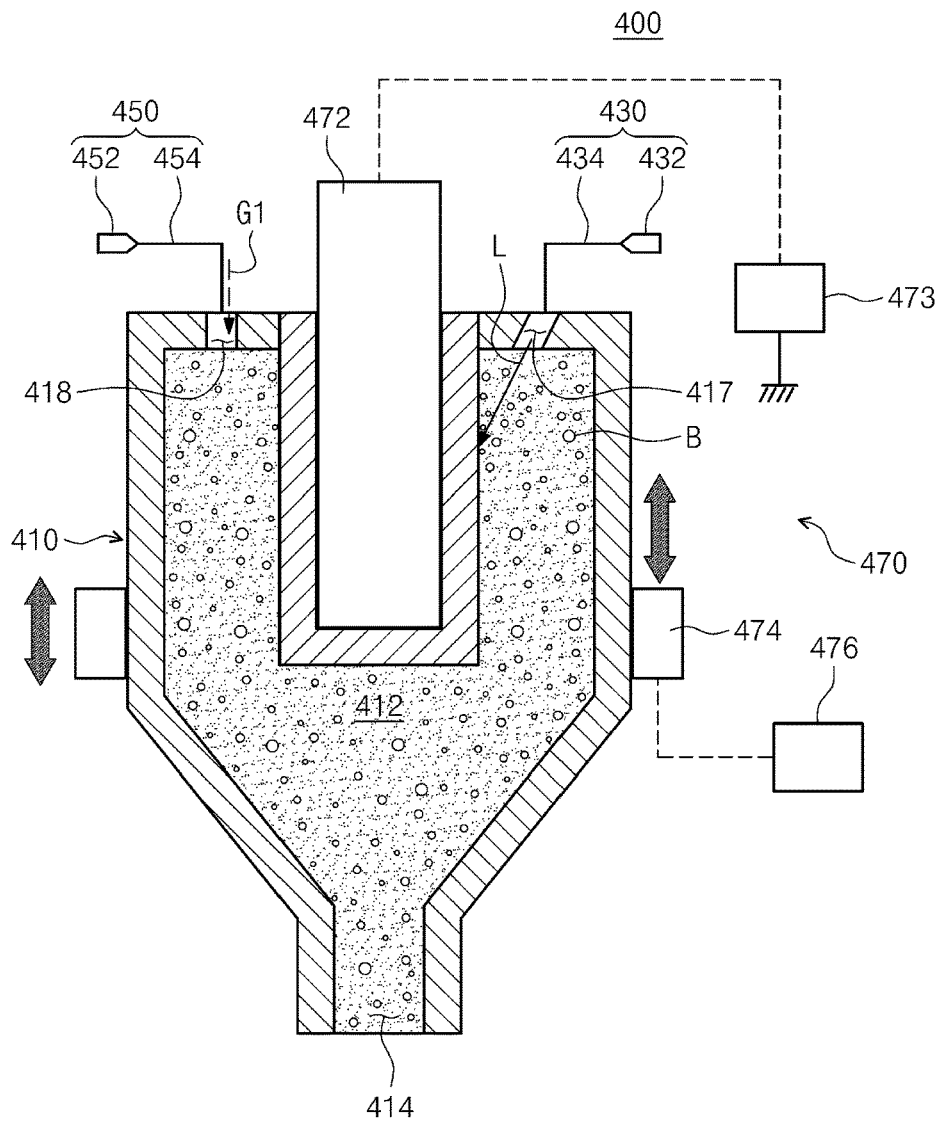
FIG. 7 is a view illustrating a state in which a first etching gas is supplied into an inner space of a nozzle to generate first liquid plasma according to an embodiment of the inventive concept.
Figure 8:
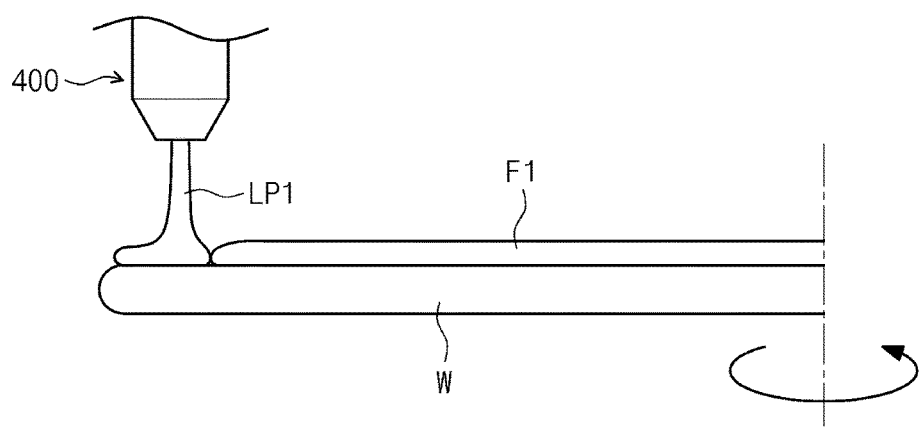
FIG. 8 is a view illustrating a state in which the nozzle dispenses the first liquid plasma onto a substrate to treat the substrate according to an embodiment of the inventive concept.
Figure 9:
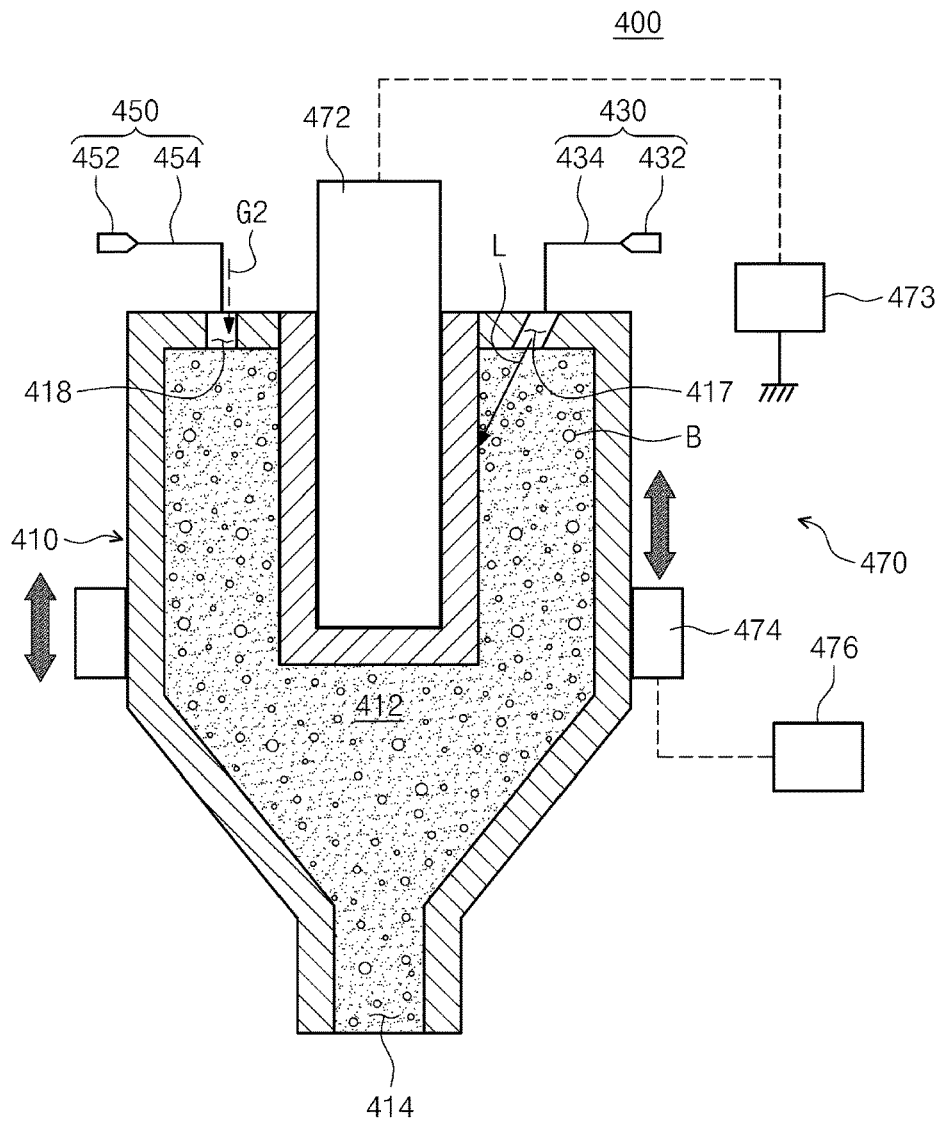
FIG. 9 is a view illustrating a state in which a second etching gas is supplied into an inner space of a nozzle to generate second liquid plasma according to an embodiment of the inventive concept.
Figure 10:
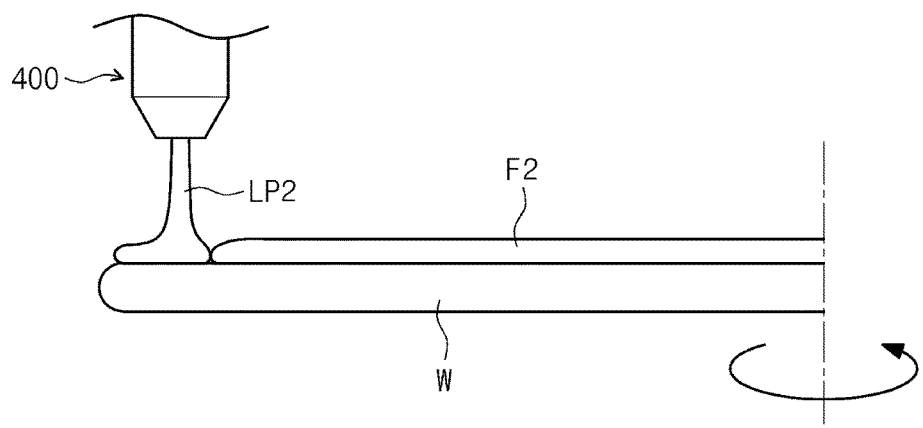
FIG. 10 is a view illustrating a state in which the nozzle dispenses the second liquid plasma onto a substrate to treat the substrate according to an embodiment of the inventive concept.

The type of etching gas G supplied into the inner space 412 may be changed depending on the type of thin film F (e.g., the material of the thin film F) on the substrate W that is treated by the liquid plasma LP. For example, as illustrated in FIGS. 7 and 8, when a thin film formed on a substrate W is a first thin film F1, the controller 600 may control the liquid dispensing unit 380 to supply a first etching gas G1 into the inner space 412 of the nozzle 400 to generate first liquid plasma LP1 in the inner space 412. Furthermore, as illustrated in FIGS. 9 and 10, when a thin film formed on a substrate W is a second thin film F2, the controller 600 may control the liquid dispensing unit 380 to supply a second etching gas G2 into the inner space 412 of the nozzle 400 to generate second liquid plasma LP2 in the inner space 412. That is, according to an embodiment of the inventive concept, the types of active radicals contained in the liquid plasma LP may be variously changed depending on the type of thin film F formed on the substrate W. Examples of the type of etching gas G depending on the type of thin film F in the inventive concept are listed in the following table. However, embodiments of the inventive concept are not limited to the contents listed in the following table, and the type of thin film F existing on the substrate W and the type of etching gas G may be variously changed.

| Solid | Etch Gas | Etch Product |
| --- | --- | --- |
| Si | Cl2, CCl2F2 | SiCl2, SiCl4 |
| SiO2, Si3N4 | CF4, SF6, NH3 | SiF4 |
| Al | BCl3, CCl4, Cl2 | A2Cl6, AlCl3 |
| Photoresist | O2, O2/CF4 | CO, CO2, H2O, HF |
| Refractory metals/Silicide (Ti, W, Ta, Mo, TiSi2, WSi2, TaSi2, MoSi2) | CF4, CCl2F2, . . . | WF6, . . . |

Figure 11:
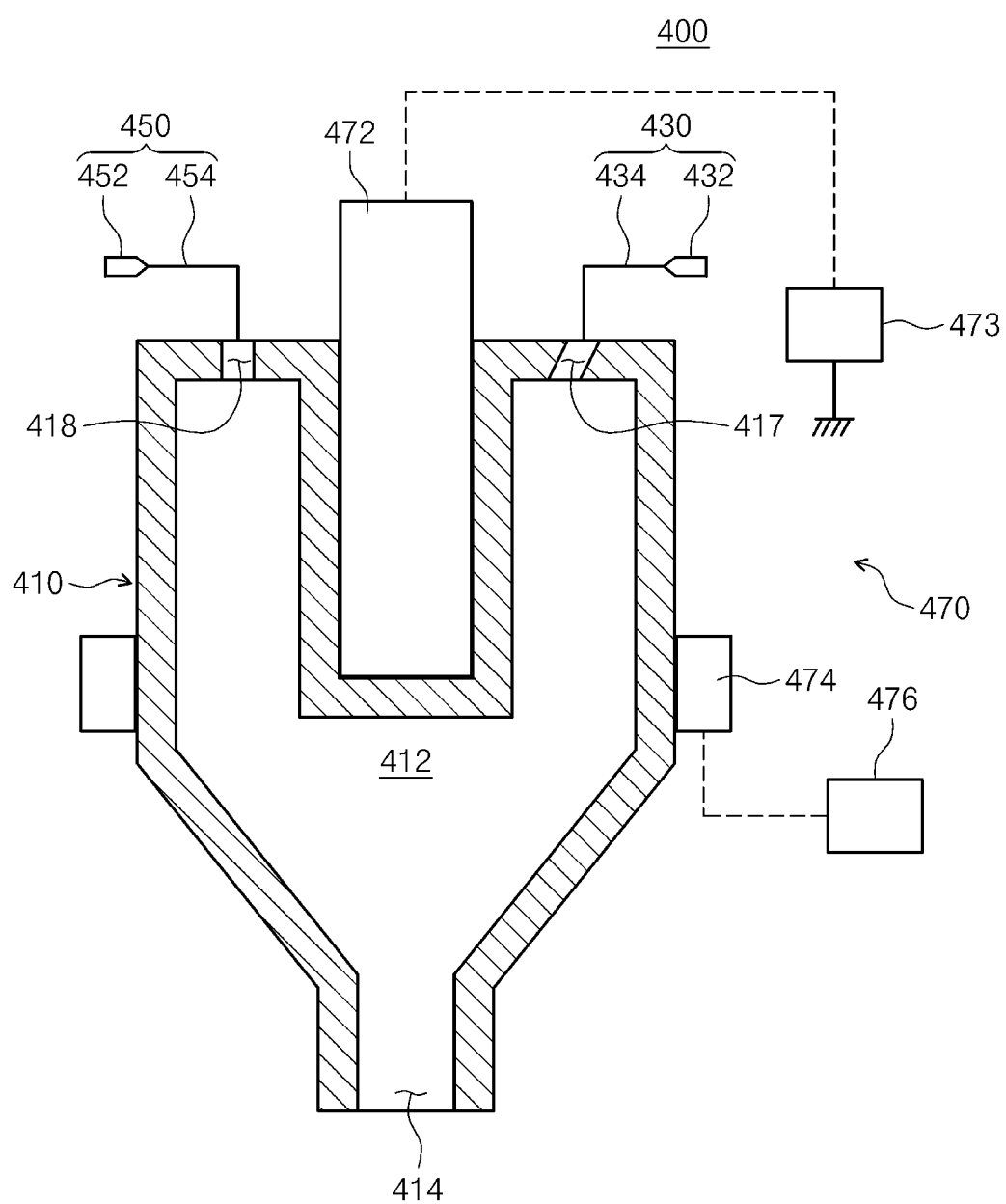
FIG. 11 is a sectional view illustrating a nozzle according to another embodiment of the inventive concept.

Although it has been described that the opening is formed in the body 410 and the insulating part 416 is inserted into the opening, the inventive concept is not limited thereto. For example, as illustrated in FIG. 11, a recess may be formed on the body 410, and the first electrode 472 may be inserted into the recess formed on the body 410. Although it has been described that the liquid plasma LP is dispensed onto the substrate W to etch the thin film F on the substrate W, the inventive concept is not limited thereto. For example, the above-described embodiments may be identically applied to all apparatuses and methods for treating a substrate W by dispensing liquid plasma LP onto the substrate W.

In FIGS. 6, 8, and 10, it has been exemplified that the liquid plasma LP is dispensed onto the upper surface of the substrate W and the edge area of the substrate W. However, the inventive concept is not limited thereto. For example, the above-described embodiments may be identically applied even when the liquid plasma LP is dispensed onto the lateral portion of the substrate W and/or the lower surface of the substrate W to perform surface treatment on the substrate W. Furthermore, the above-described embodiments may be identically applied even when the liquid plasma LP is dispensed onto the central area of the substrate W to perform surface treatment on the substrate W.

As described above, according to the embodiments of the inventive concept, a substrate may be efficiently treated.

Furthermore, according to the embodiments of the inventive concept, impurities adhering to a substrate may be effectively removed.

Moreover, according to the embodiments of the inventive concept, plasma may be efficiently generated in a treatment liquid to be dispensed onto a substrate.

In addition, according to the embodiments of the inventive concept, in generating plasma in a treatment liquid, an additional factor may be provided.

Effects of the inventive concept are not limited to the above-described effects, and it should be understood that effects of the inventive concept include all effects that can be deduced from the detailed description of the inventive concept or the configurations of the inventive concept set forth in the claims.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A nozzle for dispensing liquid plasma to etch a film formed on a substrate, the nozzle comprising:
    a body having an inner space and an exterior wall defining the inner space;
    a liquid supply unit configured to supply a liquid into the inner space;
    a gas supply unit configured to supply an etching gas into the inner space; and
    a plurality of electrodes, wherein each electrode is configured to generate plasma in the inner space,
    wherein the nozzle further includes an insulating part having a container shape open at a top of the nozzle, and the insulating part is inserted into the inner space through an opening formed in the body,
    wherein the plurality of electrodes includes:
    a first electrode; and
    a second electrode disposed on and surrounding the exterior wall of the body,
    wherein the first electrode is inserted into the insulating part and fixed in the insulating part, and the second electrode is movable on the exterior wall along a lengthwise direction of the nozzle and a lengthwise direction of the first electrode,
    wherein the body has a liquid inlet port through which the liquid supplied by the liquid supply unit is introduced into the inner space of the body, and
    wherein the liquid inlet port is provided such that the liquid introduced into the inner space through the liquid inlet port collides with an inner wall of the body to bubble in the inner space.

2. The nozzle of claim 1, wherein the liquid supply unit is configured to supply the liquid in a bubbling state into the inner space.

3. The nozzle of claim 1, wherein the liquid supply unit is configured to cause the liquid to bubble in the inner space.

4. The nozzle of claim 1, wherein the gas supply unit supplies, into the inner space, the etching gas containing at least one of $Cl_2$, $CCl_2F_2$, $CF_4$, $SF_6$, $NH_3$, $BCl_3$, $CCl_4$, $Cl_2$, $O_2$, $NF_3$, or $CH_4$.

5. The nozzle of claim 1, wherein the liquid inlet port is provided to be inclined when viewed from the front of the body.

6. The nozzle of claim 1, wherein the second electrode is movable to change a discharge area along the lengthwise direction of the nozzle, the discharge area being an area of the inner space in which the plasma is generated.

7. The nozzle of claim 6, wherein the nozzle further comprises an actuator configured to change a position of the second electrode.

8. The nozzle of claim 1, wherein the insulating part is configured to surround the first electrode.

9. The nozzle of claim 1, wherein one of the first electrode and the second electrode is connected with a power supply, and wherein the other one of the first electrode and the second electrode is grounded.

10. An apparatus for treating a substrate, the apparatus comprising:
    a support unit configured to support the substrate; and
    a nozzle configured to dispense liquid plasma to etch a film formed on the substrate supported on the support unit,
    wherein the nozzle includes:
    a body having an inner space and an exterior wall defining the inner space;
    a first electrode; and
    a second electrode disposed on and surrounding the exterior wall of the body,
    an insulating part having a container shape open at a top of the nozzle and inserted into the inner space through an opening formed in the body,
    wherein the first electrode is inserted into the insulating part and fixed in the insulating part, and the second electrode is movable on the exterior wall along a lengthwise direction of the nozzle and a lengthwise direction of the first electrode,
    wherein the body has a liquid inlet port through which the liquid plasma supplied by a liquid supply unit is introduced into the inner space of the body, and
    wherein the liquid inlet port is provided such that the liquid plasma introduced into the inner space through the liquid inlet port collides with an inner wall of the body to bubble in the inner space.

11. The apparatus of claim 10, wherein the nozzle includes:
    the liquid supply unit configured to supply a liquid into the inner space; and
    a gas supply unit configured to supply an etching gas into the inner space, wherein the first electrode and the second electrode are configured to generate the liquid plasma in the inner space.

12. The apparatus of claim 11, wherein the gas supply unit is configured to supply, into the inner space, the etching gas containing at least one of $Cl_2$, $CCl_2F_2$, $CF_4$, $SF_6$, $NH_3$, $BCl_3$, $CCl_4$, $Cl_2$, $O_2$, $NF_3$, or $CH_4$.

13. The apparatus of claim 11, wherein the apparatus further comprises a controller configured to control the gas supply unit, and
wherein the controller controls the gas supply unit such that the type of gas supplied into the inner space is changed depending on the type of film formed the substrate.

14. The apparatus of claim 11, wherein the liquid supply unit is configured to supply the liquid in a bubbling state into the inner space or causes the liquid to bubble in the inner space.

15. The apparatus of claim 11, wherein the second electrode is movable to change a discharge area along the lengthwise direction of the nozzle, the discharge area being an area of the inner space in which the liquid plasma is generated.

16. An apparatus for treating a substrate, the apparatus comprising:
a housing having a treatment space;
a support unit configured to support the substrate in the treatment space; and
a liquid dispensing unit configured to dispense a treatment liquid containing plasma onto the substrate supported on the support unit,
wherein the liquid dispensing unit includes:
a nozzle configured to dispense the treatment liquid; and
a moving member configured to move the nozzle, and
wherein the nozzle includes:
a body having an inner space and an exterior wall defining the inner space;
a liquid supply unit configured to supply the treatment liquid in a bubbling state into the inner space or cause the treatment liquid to bubble in the inner space;
a gas supply unit configured to supply an etching gas into the inner space; and
a plurality of electrodes, wherein each electrode is configured to generate plasma in the inner space,
an insulating part having a container shape open at a top of the nozzle and inserted into the inner space through an opening formed in the body,
wherein the plurality of electrodes includes:
a first electrode; and
a second electrode disposed on and surrounding the exterior wall of the body,
wherein the first electrode is inserted into the insulating part and fixed in the insulating part, and the second electrode is movable on the exterior wall along a lengthwise direction of the nozzle and a lengthwise direction of the first electrode,
wherein the body has a liquid inlet port through which the treatment liquid supplied by the liquid supply unit is introduced into the inner space of the body, and
wherein the liquid inlet port is provided such that the treatment liquid introduced into the inner space through the liquid inlet port collides with an inner wall of the body to bubble in the inner space.

17. The apparatus of claim 16, wherein the gas supply unit supplies is configured to supply, into the inner space, the etching gas containing at least one of $Cl_2$, $CCl_2F_2$, $CF_4$, $SF_6$, $NH_3$, $BCl_3$, $CCl_4$, $Cl_2$, $O_2$, $NF_3$, or $CH_4$.

18. The apparatus of claim 16, wherein the second electrode is movable to change a discharge area along the lengthwise direction of the nozzle, the discharge area being an area of the inner space in which the plasma is generated.

* * * * *